(12) United States Patent
Ikami

(10) Patent No.: US 6,750,732 B2
(45) Date of Patent: Jun. 15, 2004

(54) CIRCUIT BOARD WITH EMI SUPPRESSION

(75) Inventor: Shinichi Ikami, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 497 days.

(21) Appl. No.: 09/920,089

(22) Filed: Jul. 31, 2001

(65) Prior Publication Data

US 2003/0206160 A1 Nov. 6, 2003

(30) Foreign Application Priority Data

Aug. 1, 2000 (JP) .................................. 2000-233346

(51) Int. Cl.[7] .............................. H03H 7/46; H05K 9/00
(52) U.S. Cl. ........................... 333/12; 361/800; 361/818
(58) Field of Search .................... 333/12, 116, 128; 361/780, 794, 792, 800, 818

(56) References Cited

U.S. PATENT DOCUMENTS 6,058,022 A  *  5/2000  Gianni et al. ............... 361/794
6,329,604 B1 * 12/2001  Koya ........................ 174/255
6,477,060 B1 * 11/2002  Peter et al. ................. 361/795
6,614,325 B1 *  9/2003  Kocin ........................ 333/12

FOREIGN PATENT DOCUMENTS

JP       11-121967      4/1999    ............ H05K/9/00

* cited by examiner

Primary Examiner—Robert Pascal
Assistant Examiner—Dean Takaoka
(74) Attorney, Agent, or Firm—Schmeiser, Olsen & Watts; William H. Steinberg

(57) ABSTRACT

A microstrip-type of circuit board is used as a source driver for a liquid crystal display. Video signal buses extend in a longitudinal direction on the board. Along a centerline of the longitudinal direction of the board, there are provided through vias to which a signal from a tab driver is propagated. Each video signal bus has a plurality of through vias disposed symmetrically with respect to the though vias disposed along the centerline of the longitudinal direction of the board, with tab leads electrically connected to the symmetrically disposed through via. The substantial symmetry of the circuit board provides the advantage of substantially suppressing EMI.

20 Claims, 18 Drawing Sheets

[Figure 1]
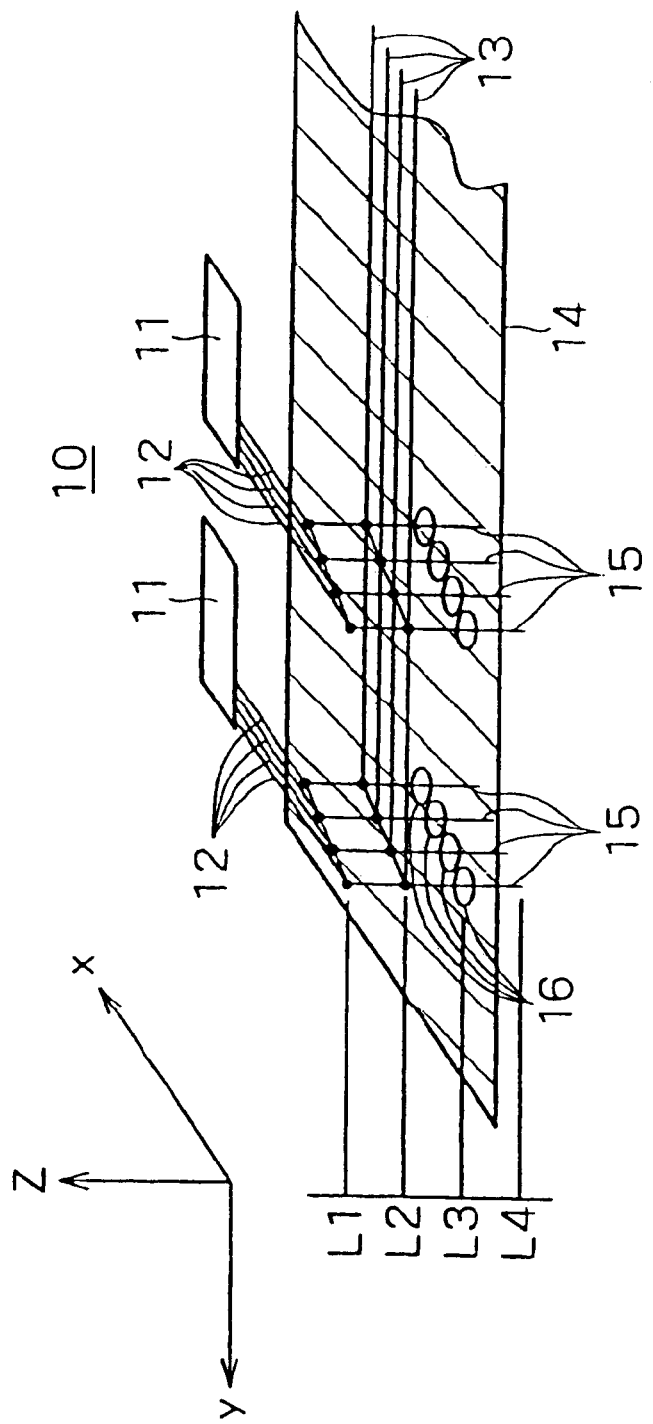

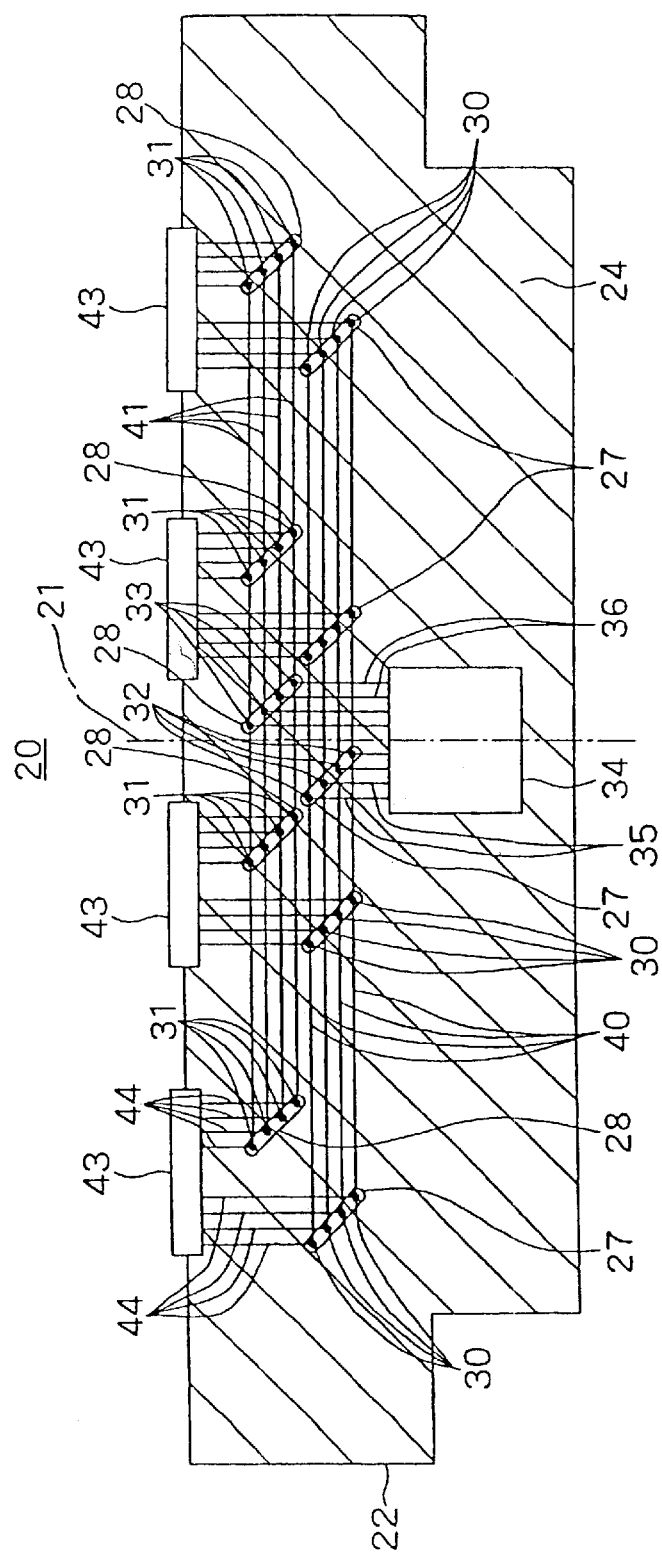
[Figure 2]

[Figure 3]
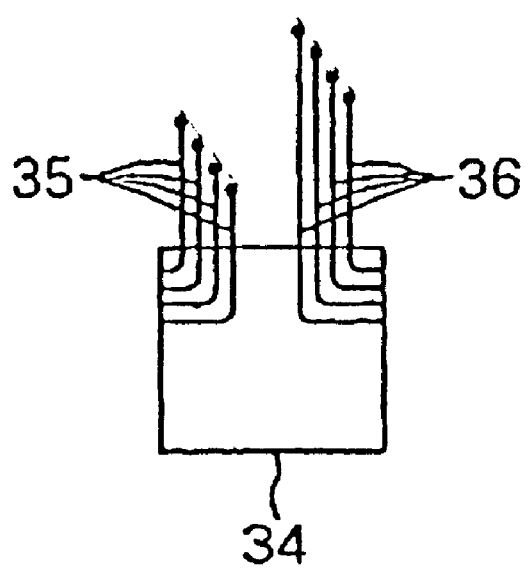

[Figure 4]
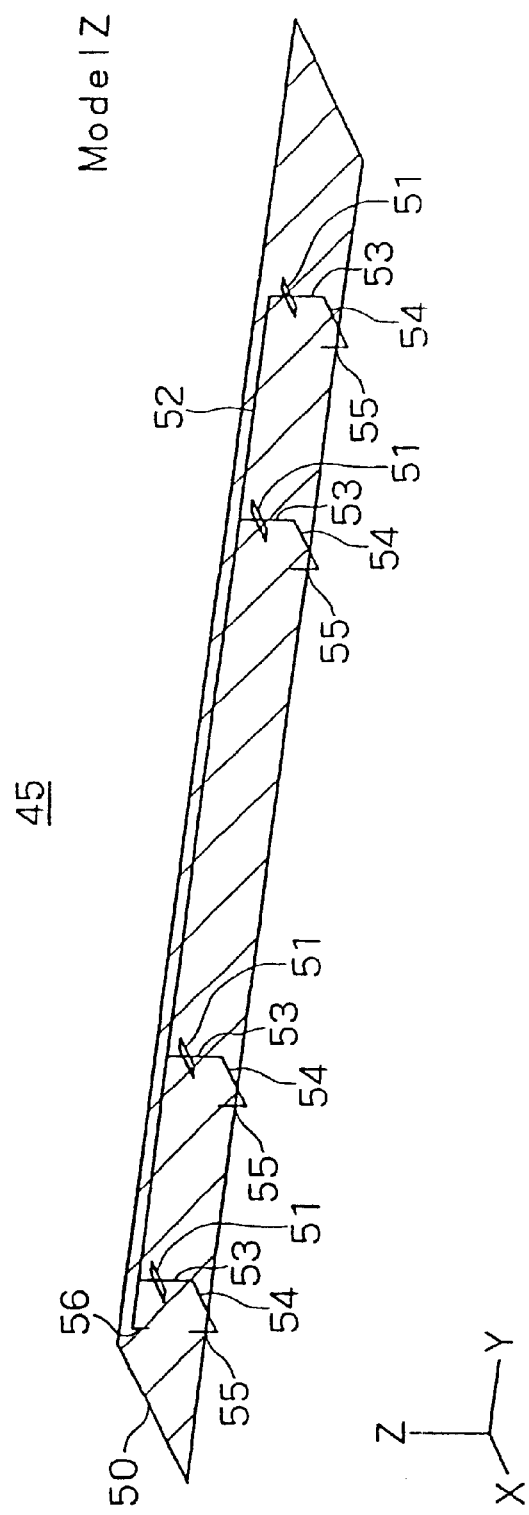

[Figure 5]
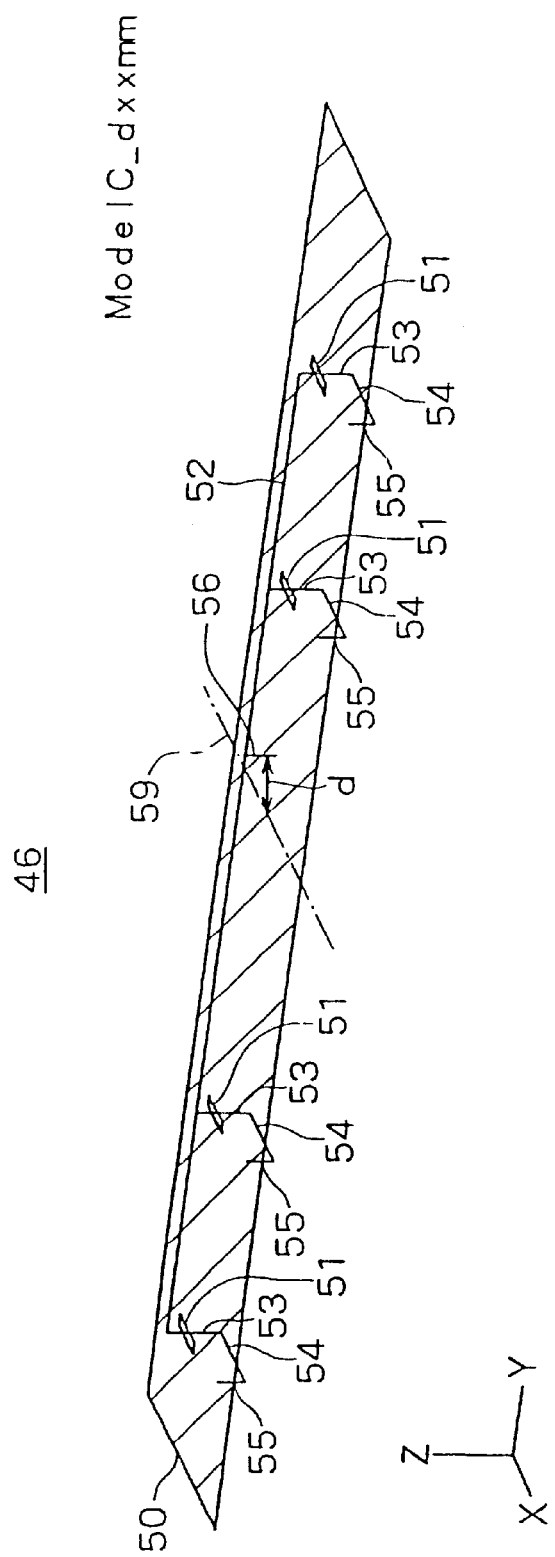

[Figure 6]
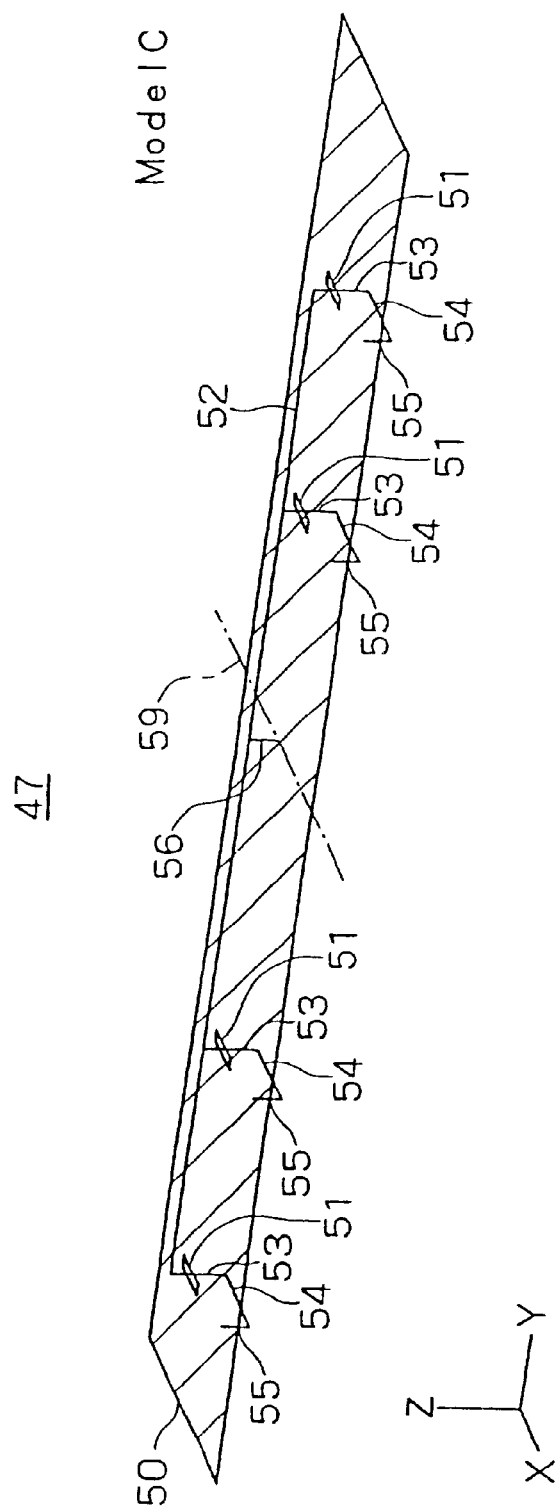

[Figure 7]
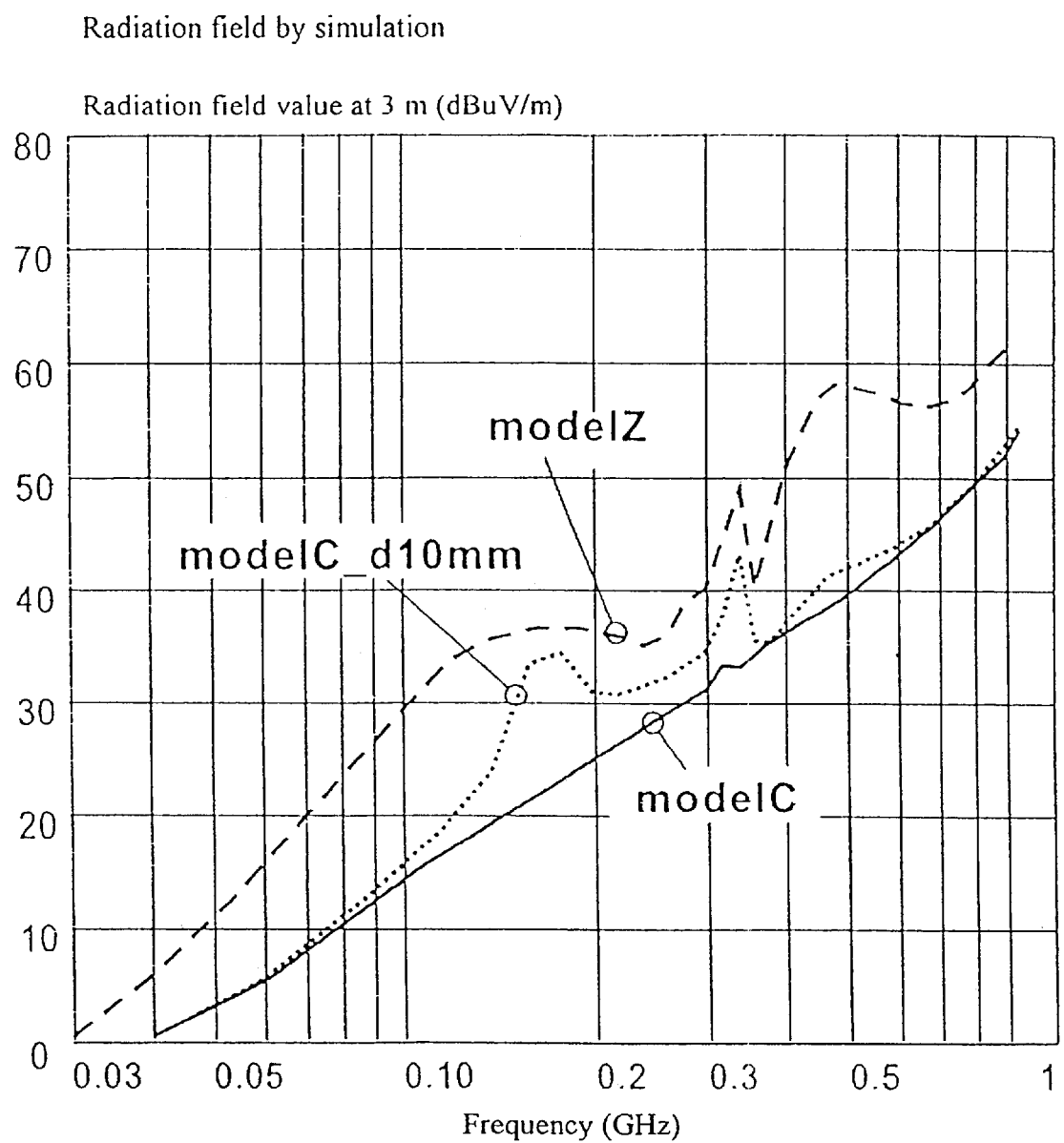

[Figure 8]
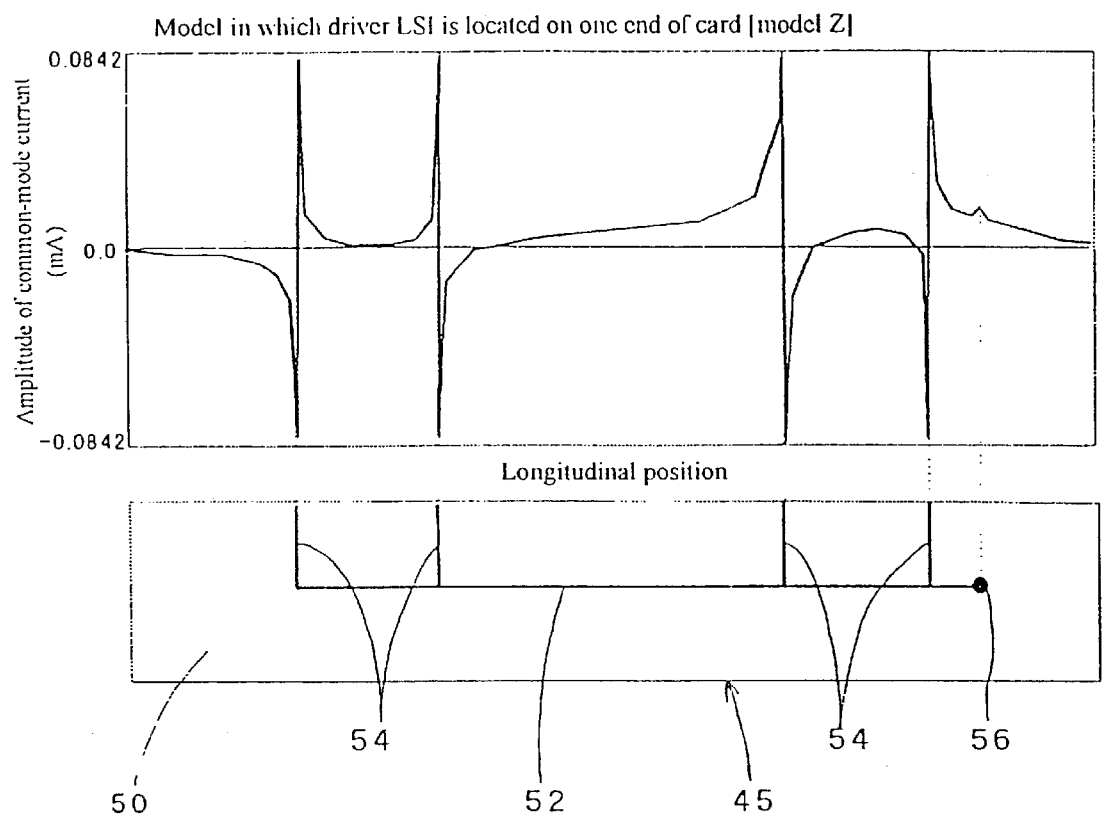

[Figure 9]
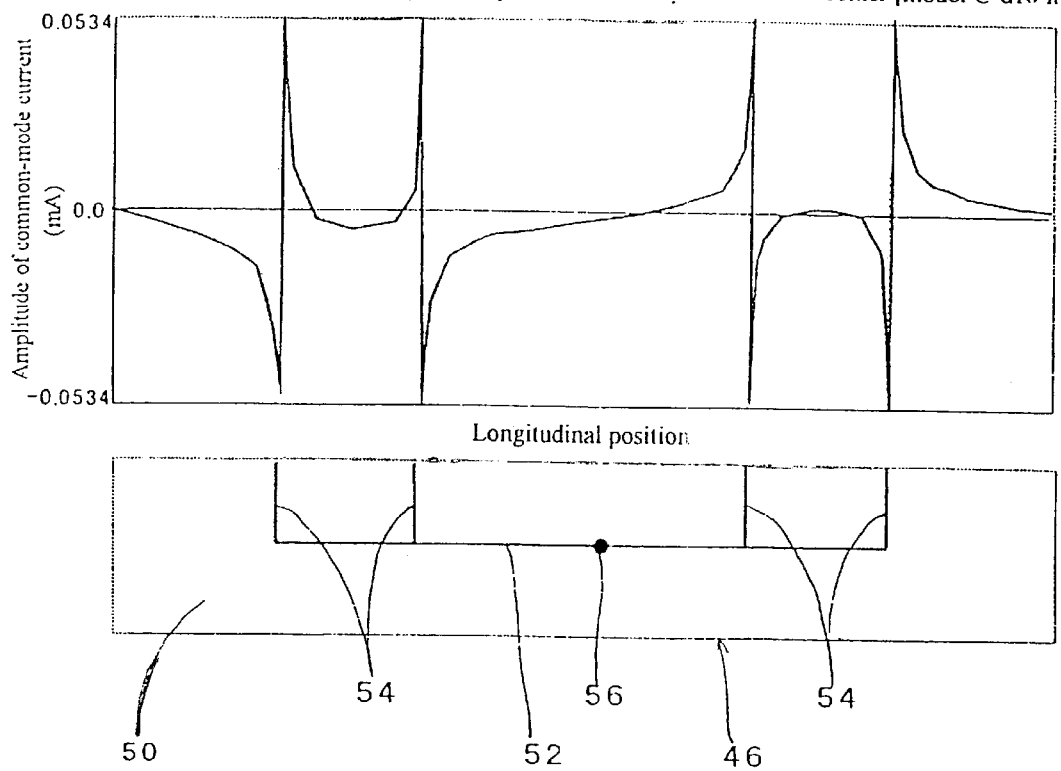

[Figure 10]
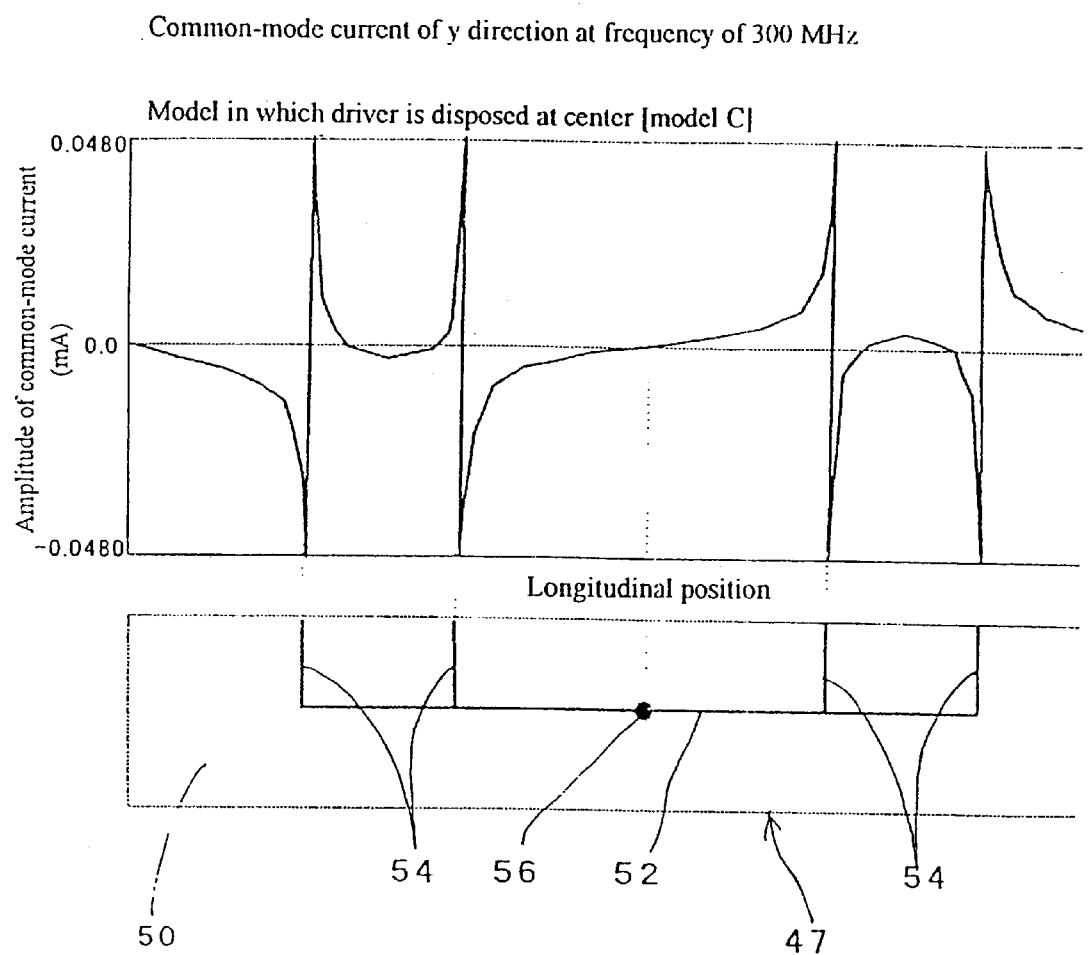

[Figure 11]
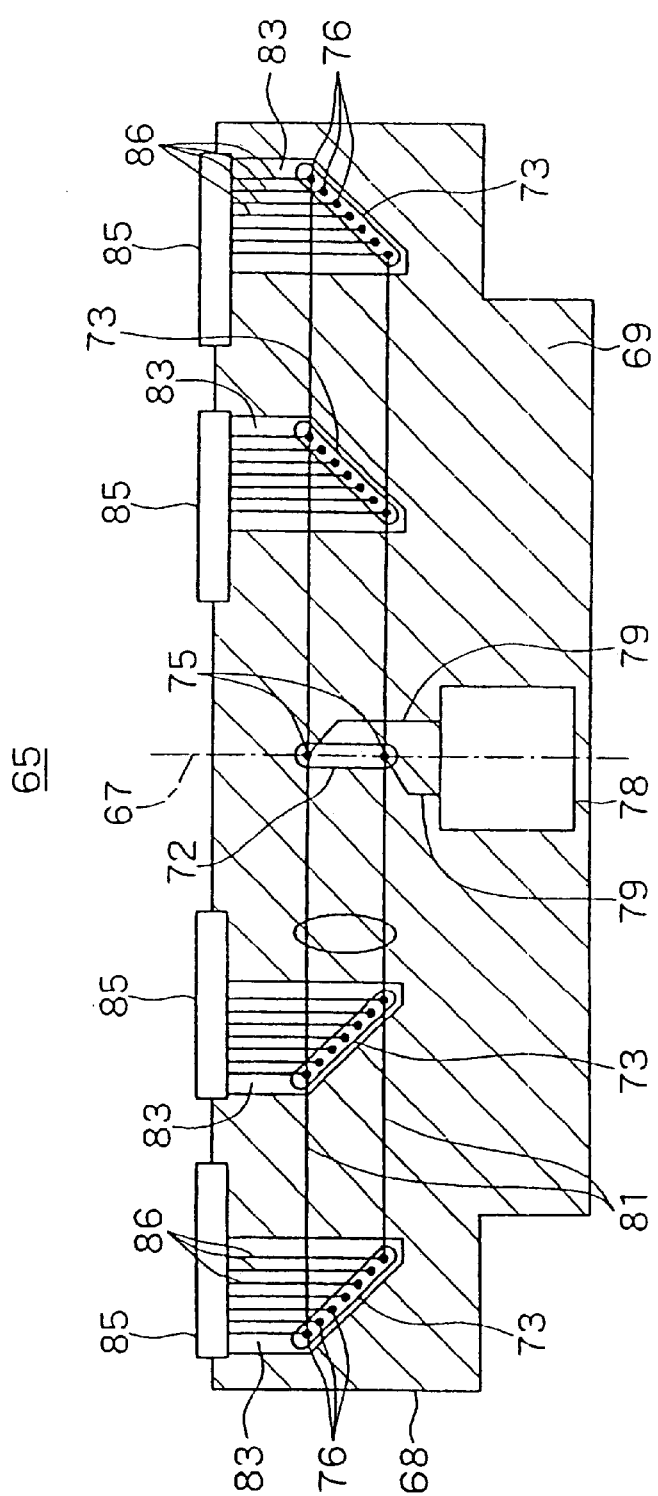

[Figure 12]
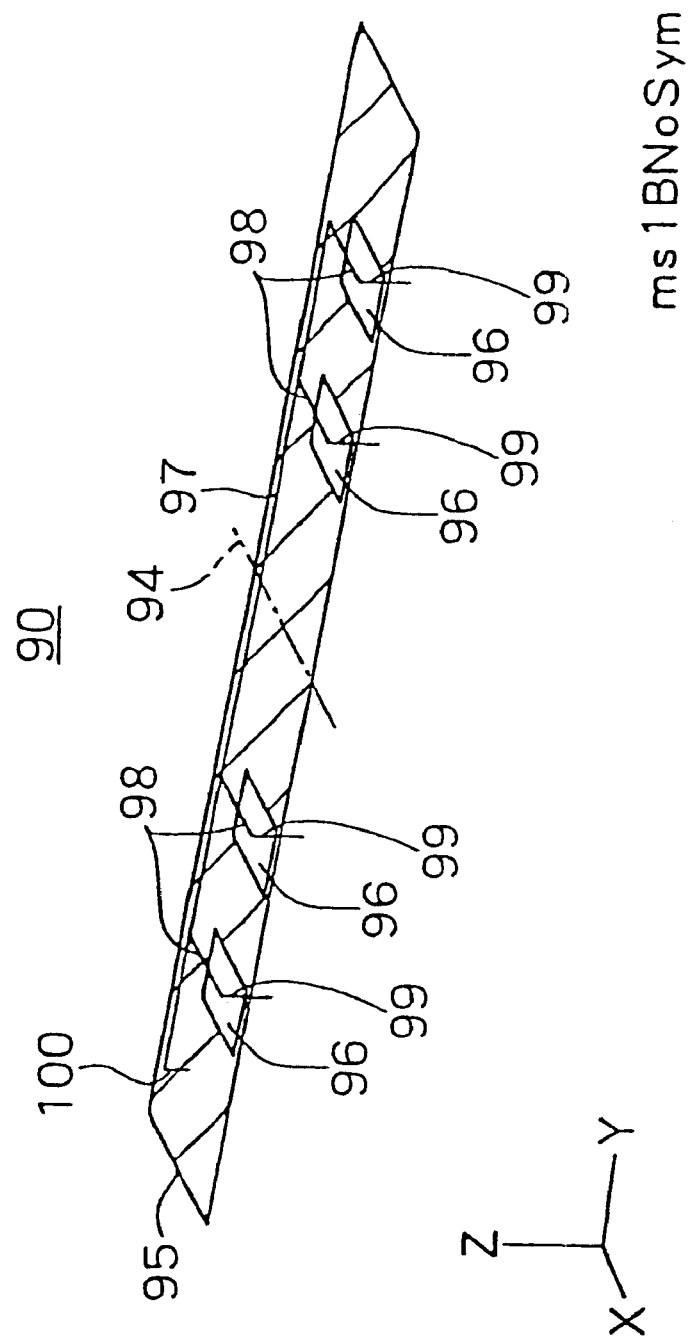

[Figure 13]
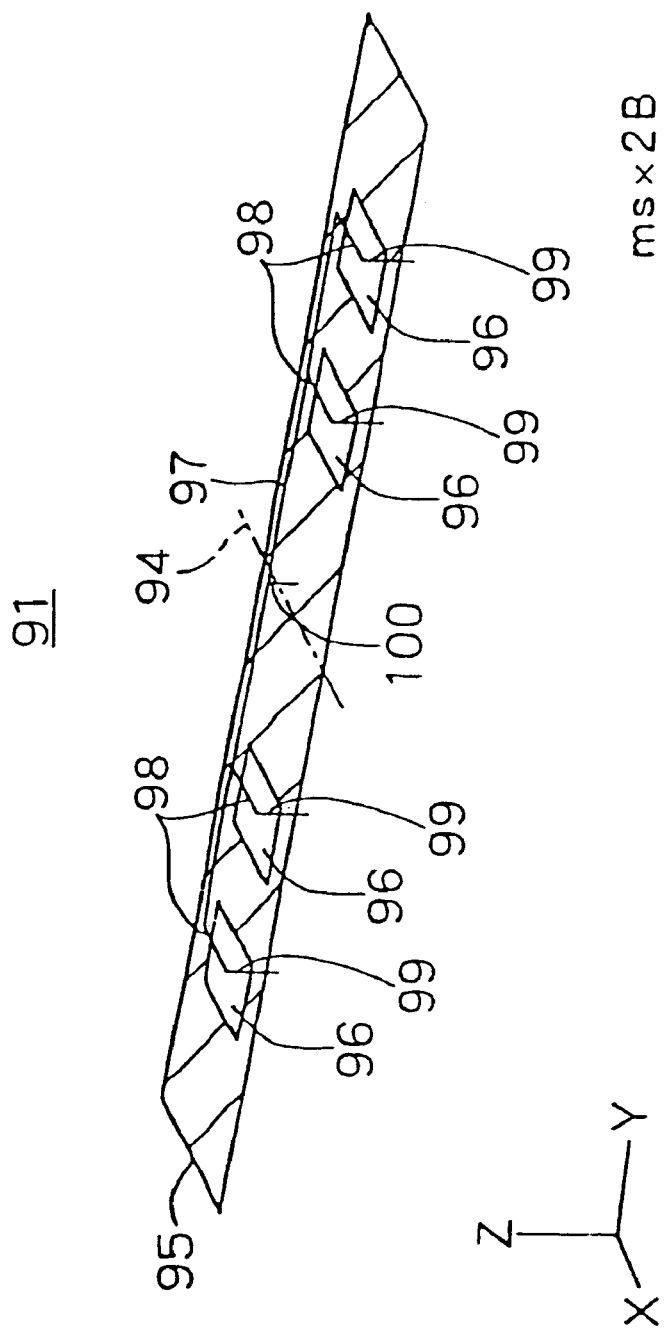

[Figure 14]
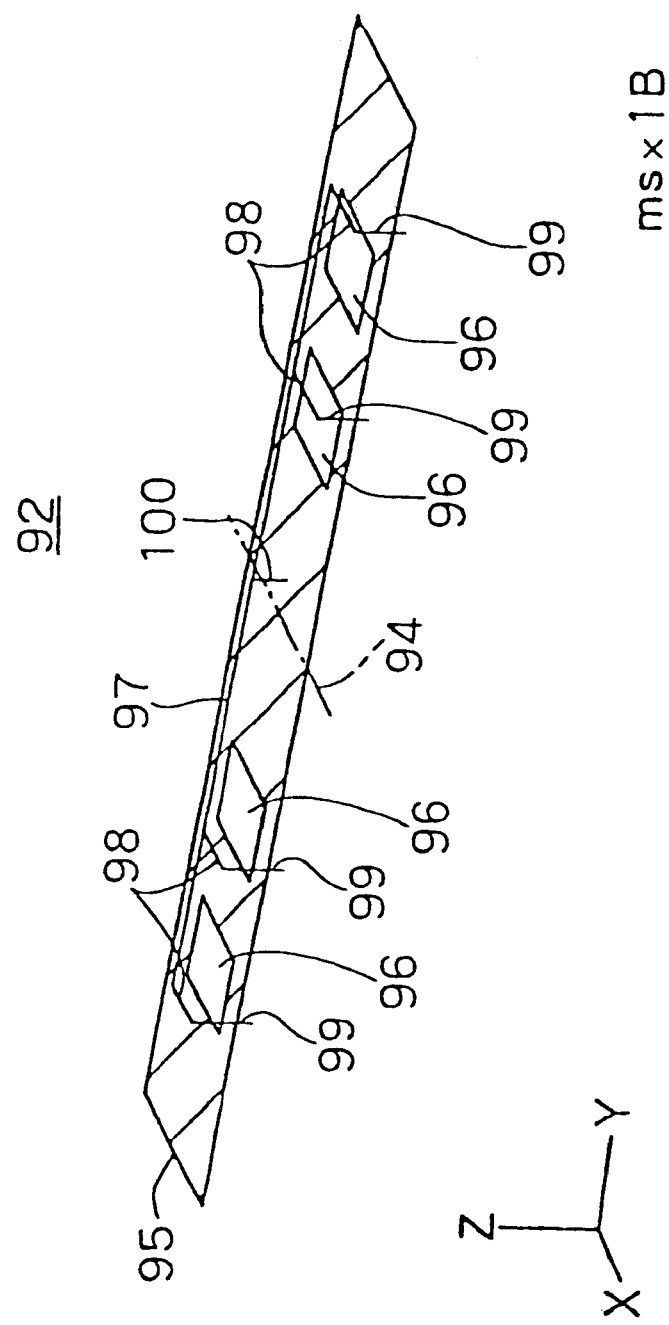

[Figure 15]
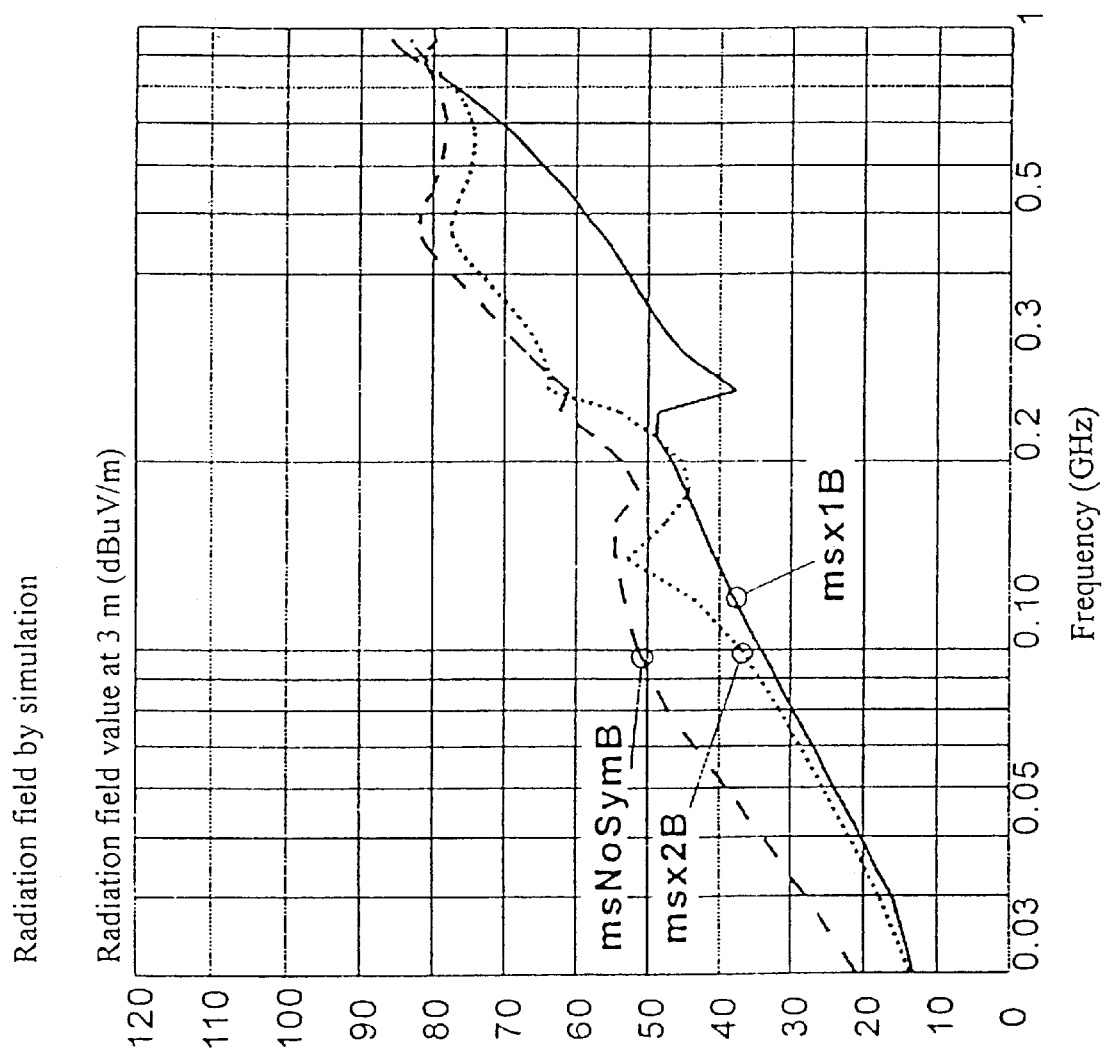

[Figure 16]
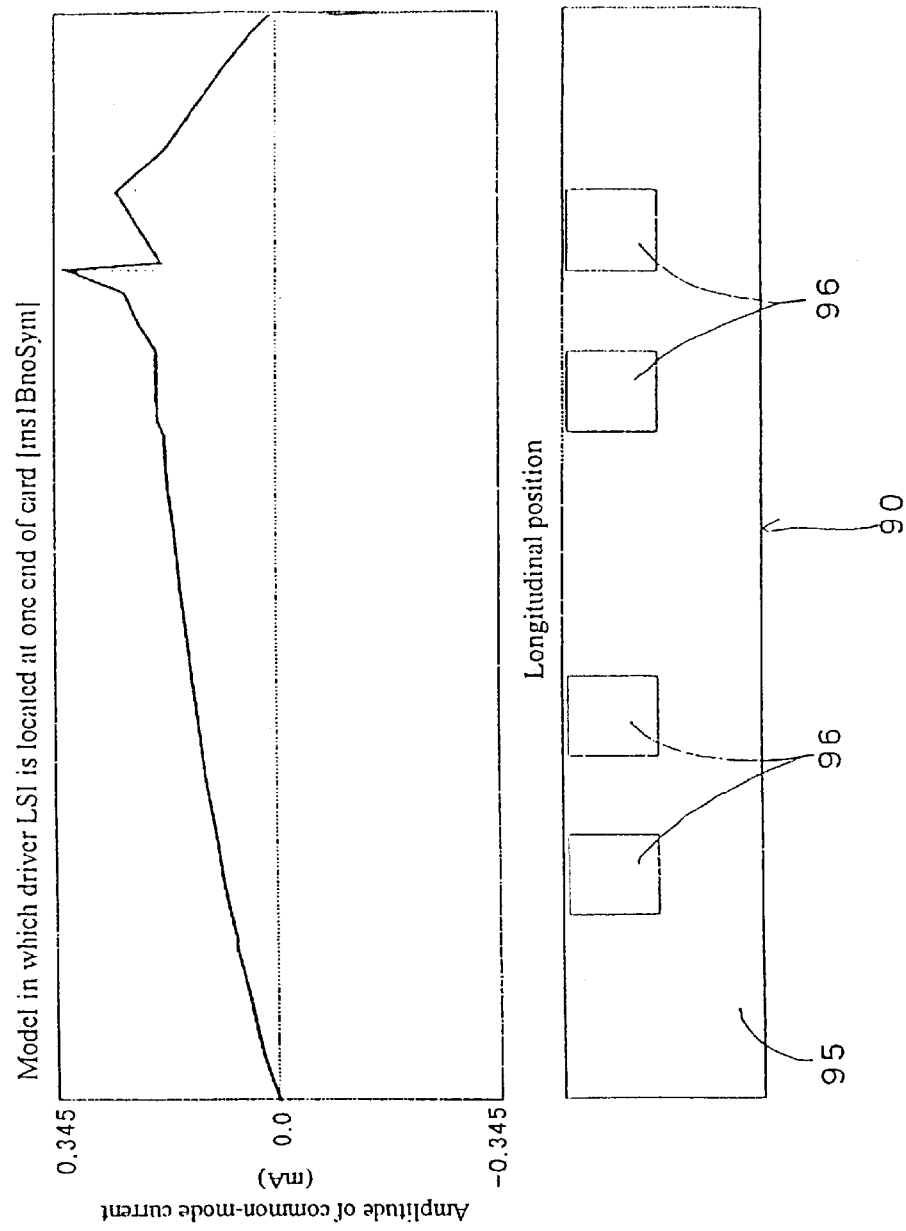

[Figure 17]
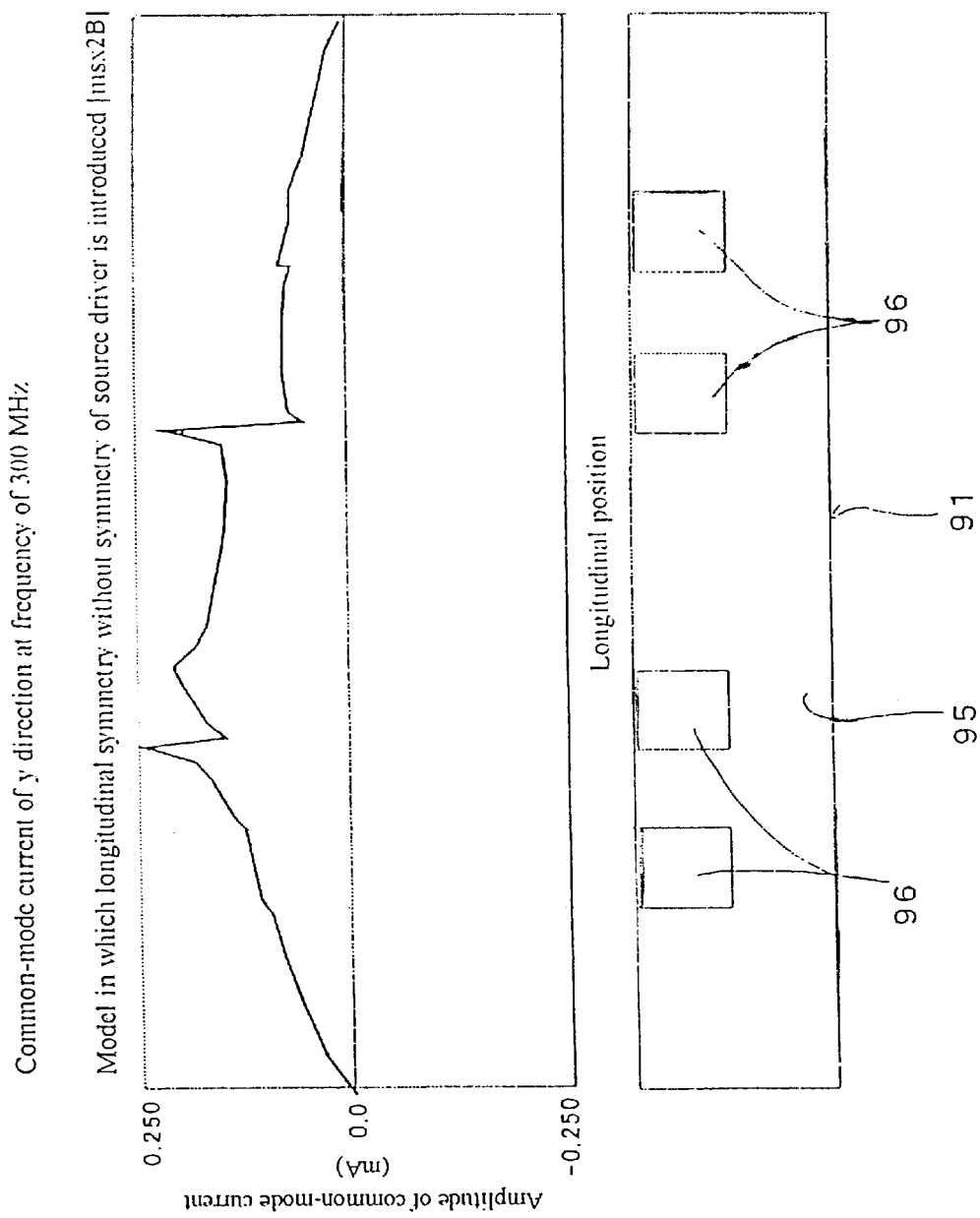

[Figure 18]
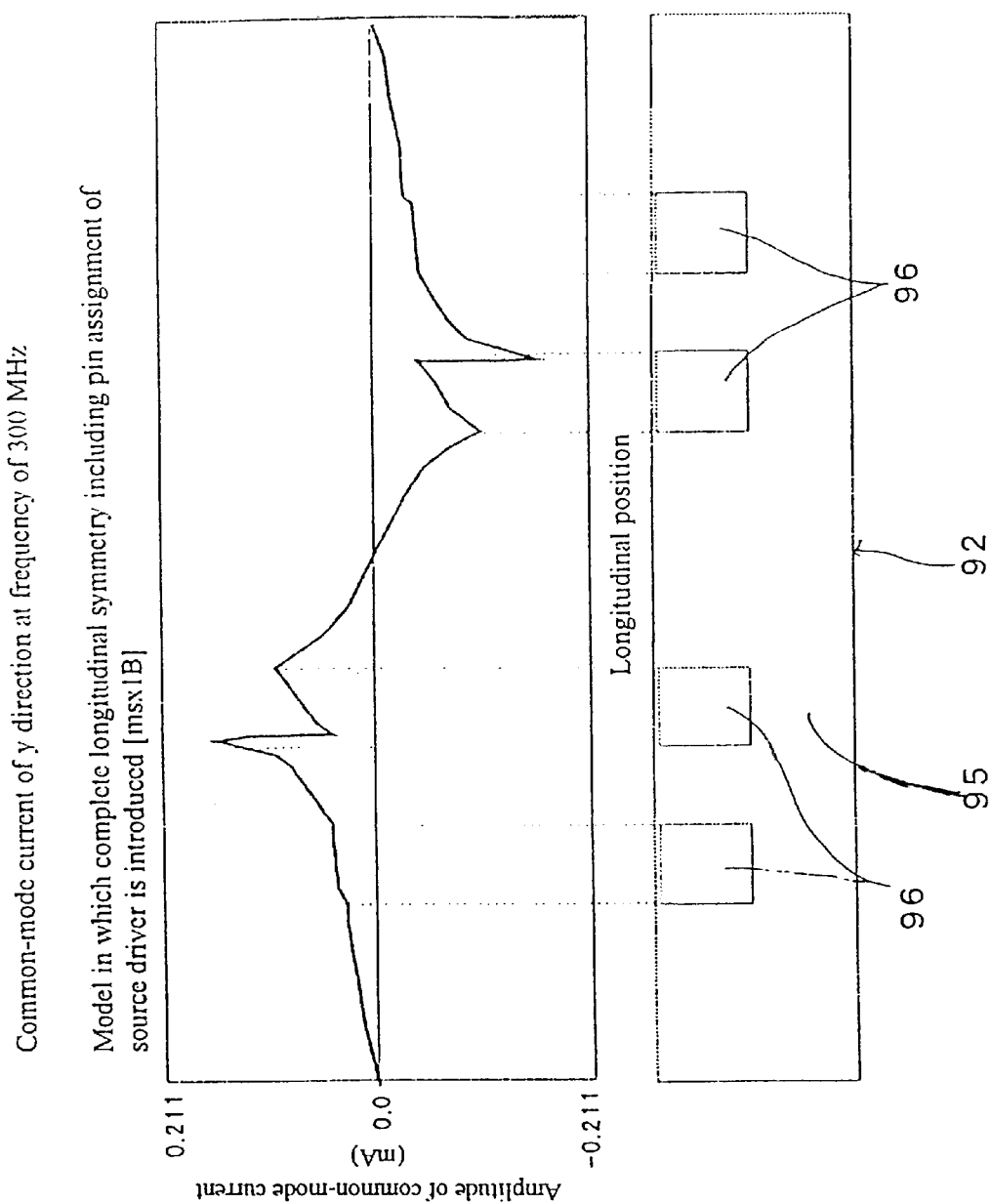

CIRCUIT BOARD WITH EMI SUPPRESSION

TECHNICAL FIELD OF THE INVENTION

The present invention is related to circuit boards in which Electromagnetic Interference (hereinafter referred to as "EMI") can be suppressed, and more specifically to a microstrip-type of circuit board which is used as the driver of a liquid crystal display.

BACKGROUND OF THE INVENTION

A liquid crystal display is equipped with a source driver card and a gate driver card for displaying images. An EMI problem may be caused by the source driver card having a video signal with a maximum fundamental frequency of about 33 MHz and a clock signal having a frequency about two times thereof being provided to a signal input point Pi, for instance, for a display screen of about 1024×768 pixels.

A digital signal having a frequency of, for example, 33 MHz contains, as harmonic components, high-frequency signal components having frequencies that are integral multiples (n) thereof. The magnitude of each harmonic component is indirectly proportional to n for a signal having a signal duty of, for example, 50%. However, in order to provide a signal quality that is required for a digital signal, it is necessary to have harmonic components of a sufficiently large n (for example, n=5). A signal having only a fundamental frequency, or a harmonic component with an integral multiple of one, is typically a pure sinusoidal wave, and usually does not meet requisite criteria, for example rise time, to be recognized as a digital signal. If the frequency of a signal is relatively low such that there are harmonic components of between about 30 MHz to 1 GHz corresponding to a sufficiently large n such that sufficient signal quality is provided, EMI problems can be avoided by transmitting the signal while suppressing the harmonic components by using a filter or the like. However, given that the fundamental frequency is about 33 MHz means that use of such a filter would suppress both radiated EMI and the fundamental frequency. Therefore, additional means are needed, for example, covering the whole device with an electromagnetic shield. However, use of an electromagnetic shield is not practical as it would shield the front display portion thereby preventing the screen from being seen.

A conventional EMI suppression measure in a source driver card is that of providing the source driver card with a strip line structure, in which both surfaces of the card are grounded using a metal foil, or one surface is grounded and the other surface is electrically connected to a power supply, but this approach can be costly and the resulting card can become thicker than desired.

Another measure is that of utilizing a microstrip structure for a source driver card, that is, one entire circuit layer of a source driver card is grounded and utilized as a ground plane. However, if this approach is taken, there is a problem if there are openings on the ground plane as a return current on the ground plane may detour around the openings causing a common-mode current. Common-mode current is defined hereinbelow. In a loop circuit comprising a signal driver source, a load, a signal line connecting the signal side terminals of the signal driver source and the load, and a current return path connecting the ground terminal of the load and the ground terminal of the signal driver source, the signal driver source provides a high-frequency signal. In this loop circuit, through the effects of surrounding metallic objects, differences between the shapes of the signal line and the current return path, and the like, a current difference is created between current flowing in the signal line and current flowing in a particular portion of the current return path as measured at a particular moment in time. This current difference is known as the common-mode current of that portion at that moment. The electromagnetic wave caused by the common-mode current is very large as compared with the radiation caused by a loop current of the same amplitude, and is a primary cause of EMI.

Publication of Japanese Unexamined Patent Application No. 11-121967 discloses that degrees of symmetry $\delta$ of four-terminal circuits (for both an electric circuit and a power circuit containing a transmission line) can be made equal so as to suppress EMI. However, the symmetry disclosed in this publication teaches consideration of symmetry for circuit constants between electric circuits and power circuits containing a transmission line, which is substantially different from a spatial arrangement as taught by the present invention described hereinbelow. Furthermore, the method taught by the publication is that of determining the circuit constant of the transmission line with respect to the circuit constant of the electric circuit. This method does not suppress EMI by determining the structure of a transmission line such as a signal bus or a ground surface.

OBJECTS OF THE INVENTION

It is a primary object of the present invention to provide a circuit board that suppresses EMI emanating from the circuit board.

It is another object of the invention to provide a circuit board that suppresses EMI emanating from the circuit board by the circuit board having a substantially symmetrical structure.

It is yet another object of the invention to provide a circuit board that reduces EMI generated by a clock signal as compared to many known such circuit boards.

It is yet another object of the invention to provide a circuit board with a reduced number of layers as compared to many known such circuit boards.

In accordance with one embodiment of the invention, there is provided a circuit board which comprises a ground layer, at least one circuit layer and at least one insulation layer between the ground and circuit layers. The at least one circuit layer has at least one signal bus that extends in a substantially straight line in a longitudinal direction of the circuit board and is adapted for being supplied with a high-frequency signal. The ground layer has openings therein. The at least one signal bus has a signal input point adapted to receive the high-frequency signal which has a frequency higher than a particular value and a plurality of signal output points adapted to transmit the high-frequency signal. The plurality of signal output points are disposed substantially symmetrically with respect to the signal input point in the at least one signal bus and the openings are disposed substantially symmetrically with respect to the signal input point to provide EMI suppression for the circuit board.

In accordance with another embodiment of the invention, there is provided a circuit board which comprises a ground layer, at least one circuit layer and at least one insulation layer between the ground and circuit layers. The at least one circuit layer has at least one signal bus that extends in a substantially straight line in a longitudinal direction of the circuit board and is adapted for being supplied with a high-frequency signal. The ground layer has openings therein. The at least one signal bus has a signal input point adapted to receive the high-frequency signal which has a frequency higher than a particular value and a plurality of signal output points adapted to transmit the high-frequency signal. The plurality of signal output points are disposed substantially symmetrically with respect to the signal input point in the at least one signal bus and the openings are disposed substantially symmetrically with respect to the signal input point to provide EMI suppression for the circuit board. The circuit board further includes a side edge which has a plurality of tab modules located thereon which have pins thereon. The tab modules extend in a longitudinal direction of the circuit board and the plurality of signal output points of the at least one signal bus are correspondingly connected to the pins on the plurality of tab modules through a plurality of tab leads. The plurality of tab leads are disposed substantially symmetrically with respect to a straight line passing through the signal input point of the at least one signal bus and substantially perpendicular to the at least one signal bus.

BRIEF DESCRIPTION OF THE DRAWINGS

FIG. 1 is a perspective view of a microstrip-type source driver card according to one embodiment of the invention.

FIG. 2 is a schematic diagram of a microstrip-type source driver card according to one embodiment of the invention.

FIG. 3 is a schematic diagram showing driver output lines extending from a tab driver.

FIG. 4 is a perspective view of a first simulation model for performing a radiation field simulation for one embodiment of the invention.

FIG. 5 is a perspective view of a second simulation model for performing a radiation field simulation for one embodiment of the invention.

FIG. 6 is a perspective view of a third simulation model for performing a radiation field simulation for one embodiment of the invention.

FIG. 7 is a diagram showing results of radiation field simulations for the models of FIGS. 4, 5 and 6.

FIG. 8 is a diagram showing a relationship between longitudinal position and common-mode current for a simulation based on the model of FIG. 4.

FIG. 9 is a diagram showing a relationship between longitudinal position and common-mode current for a simulation based on the model of FIG. 5.

FIG. 10 is a diagram showing a relationship between longitudinal position and common-mode current for a simulation based on the model of FIG. 6.

FIG. 11 is a schematic diagram of a microstrip-type source driver card according to another embodiment of the invention.

FIG. 12 is a perspective view of a first simulation model for performing a radiation field simulation for another embodiment of the invention.

FIG. 13 is a perspective view of a second simulation model for performing a radiation field simulation for another embodiment of the invention.

FIG. 14 is a perspective view of a third simulation model for performing a radiation field simulation for another embodiment of the invention.

FIG. 15 is a diagram showing results of radiation field simulations for the models of FIGS. 12, 13 and 14.

FIG. 16 is a diagram showing a relationship between longitudinal position and common-mode current for a simulation based on the model of FIG. 12.

FIG. 17 is a diagram showing a relationship between longitudinal position and common-mode current for a simulation based on the model of FIG. 13.

FIG. 18 is a diagram showing a relationship between longitudinal position and common-mode current for a simulation based on the model of FIG. 14.

BEST MODE FOR CARRYING OUT THE INVENTION

For a better understanding of the present invention, together with other and further objects, advantages and capabilities thereof, reference is made to the following disclosure and appended claims in connection with the above described drawings.

In one aspect, the circuit board comprises a ground layer and at least one circuit layer, which are stacked and insulated from each other by at least one insulation layer, a particular circuit layer having at least one signal bus extending as a substantially straight line in a longitudinal direction of the circuit board and adapted for being supplied with a high-frequency signal, and the ground layer having openings therein. In the circuit board, each signal bus has a signal input point adapted to receive a high-frequency signal having a frequency higher than a particular value and a plurality of signal output points adapted to transmit the high-frequency signal, the plurality of signal output points being disposed substantially symmetrically with respect to the signal input point in each signal bus and openings which are also disposed substantially symmetrically with respect to the signal input point.

In the following description, the width direction, longitudinal direction and thickness direction of the circuit board are defined as X-axis direction, Y-axis direction and Z-axis direction, respectively. The direction in which the signal bus extends is the Y-axis direction, and the direction in which the ground layer and circuit layer of the circuit board are stacked is the Z-axis direction.

In the case of a high-frequency signal as defined herein having a frequency higher than a particular value, the particular value may be, in one example 30 MHz, and the high-frequency signal may include harmonic components in the range of, for example 30 MHz to 1 GHz. A digital signal is understood to include harmonic components which are integral multiples of its fundamental frequency, and each harmonic component is a high-frequency signal. The fundamental frequency is defined as the frequency corresponding to the period of the smallest repetitive pattern of that signal. For example, the fundamental frequency of a digital signal having a signal pattern that repeats at 100 ns is 10 MHz, and in this digital signal, the harmonic components three times that or higher are high-frequency signals of 30 MHz or higher. The digital clock signal flowing in a source driver card for a liquid crystal display may have a fundamental frequency of about 66 MHz with high-frequency signals of 66 MHz, 133 MHz, etc. as its harmonic components.

Current provided from a signal input point flows through the signal bus in the Y-axis direction to a signal output point. The current returns to the position of the signal output point on a ground surface through a circuit connected between the signal output point and the ground. The current returns to the position of the signal input point along the ground surface immediately below a signal bus. Since an opening for through vias related to other signal output points are formed on the ground surface just below the signal bus, the current returning from the signal output point to the signal input point along the ground surface detours around the opening, generating a common-mode current in the Y-axis direction. In the circuit board, the signal input point exists at the center of each signal bus, and the positions of the signal output points and the openings are substantially symmetrical with respect to the signal input point. Accordingly, the common-mode current flowing on a first side with respect to the signal input point and the current flowing on a second side opposite to the first side have substantially the same value and opposite directions. The radiated fields generated by the respective common-mode currents, when observed at a remote point, for example at a distance of 10 m, have substantially the same magnitude and opposite directions because the source common-mode currents are substantially the same in value and opposite in direction, so that the radiated fields offset each other. Thus, EMI radiation as a total sum approaches zero, and EMI therefore can be substantially suppressed.

In another aspect, the circuit board includes a plurality of tab modules positioned on a side edge and extending in a longitudinal direction, each signal output point of each signal bus is electrically connected to the corresponding signal input point of the corresponding tab module through a tab lead. The tab lead electrically connected to each signal bus is disposed substantially symmetrically with respect to a straight line passing through the signal input point of each signal bus and substantially perpendicular to each signal bus.

A straight line passing through the signal input point in each signal bus and substantially perpendicular to each signal bus is defined as a symmetry line. Since a tab lead is substantially symmetrical with respect to the symmetry line, electromagnetic radiation fields generated by common-mode currents in portions of a tab lead that are substantially symmetrical to each other with respect to the symmetry line substantially cancel each other out, thereby reducing EMI.

In a third aspect, the circuit board includes electrically conductive through vias positioned in the openings, the signal output points being on the through vias, and a tab lead extending from the corresponding through via in a direction substantially perpendicular to the signal bus.

In a fourth aspect, the circuit board has signal input points disposed on a substantially straight symmetrical line substantially perpendicular to the signal bus.

Since the signal input points are disposed on the symmetrical line, the signal output points are substantially symmetrical with respect to the symmetrical line in each signal bus, and the openings are also substantially symmetrical with respect to the symmetrical line. Thus, the common-mode currents in the circuit board are substantially symmetrical with respect to the symmetrical line, and the radiation fields generated by the common-mode currents form symmetrical pairs which offset each other when observed at remote points, thereby substantially suppressing EMI.

In a fifth aspect, the circuit board includes a first inclined line that inclines with respect to both the signal bus and the tab lead, and a second inclined line that inclines substantially symmetrically with respect to the first inclined line about the symmetrical line. Each opening is formed for a row of through vias of the plurality of signal buses which sequentially lie in a direction substantially perpendicular to the signal buses and are arranged in a substantially straight line. The openings on one side of the symmetrical line are substantially parallel to the first inclined line, and the openings on the other side of the symmetrical line are substantially parallel to the second inclined line.

The opening containing the through vias related to the signal input points is positioned on the symmetrical line, while the openings containing the through vias related to the signal output points are substantially parallel to the first inclined line on one side of the symmetrical line and substantially parallel to the second inclined line on the other side of the symmetrical line. Thus, the common-mode currents in the circuit board are substantially symmetrical with respect to the symmetrical line, and the radiation fields generated by common-mode currents each form symmetrical pairs which offset each other when observed at remote points, by which EMI from the circuit board can be substantially suppressed.

In a sixth aspect, the ground surface of the ground layer has a substantially symmetrical shape with respect to the symmetrical line.

Since the ground surface is shaped to be substantially symmetrical with respect to the symmetrical line, the common-mode currents in the circuit board become substantially symmetrical with respect to the symmetrical line, and the radiation fields generated by common-mode currents each form symmetrical pairs which offset each other when observed at remote points, by which EMI from the circuit board can be substantially suppressed.

In a seventh aspect, there is provided an insulation surface in the ground layer for tab leads from which the ground surface is removed for each tab module. The tab leads are formed in the insulation surface, the insulation surface for tab leads being formed substantially symmetrically with respect to the symmetrical line.

By forming tab leads in the ground layer, the number of layers of the circuit board can be reduced as compared to many known such circuit boards. The insulation surface for tab leads corresponding to the portion of the ground layer from which the ground surface has been removed is formed substantially symmetrically with respect to the symmetrical line. Thus, the common-mode currents in the circuit board become substantially symmetrical with respect to the symmetrical line, and the radiation fields generated by common-mode currents each form symmetrical pairs which offset each other when observed at remote points, by which EMI from the circuit board can be substantially suppressed.

In an eighth aspect, one of the signal buses is a clock signal bus, the insulation surface for tab leads having a first side extending along one of the openings, the clock signal bus positioned such that the through via to which it is electrically connected is on the end of the first side which is farther from the tab module than any of the through vias to which other signal buses are electrically connected.

Since the clock signal usually has a repetition period shorter than other digital signals such that its fundamental frequency is relatively high, a harmonic thereof having a lower integral multiple may be the high-frequency signal having a frequency higher than a particular value. Generally, a harmonic having a lower integral multiple has a larger amplitude as compared with that of a greater integral multiple, such that a larger common-mode current is generated. On the other hand, openings are formed in the ground surface for insulation between the signal output points, the openings causing the current to detour around these in the ground surface. The length of a bypass for the current becomes shorter for the current of the signal bus related to the through via disposed at the end of an opening. Generally, the common-mode current becomes smaller as the bypass becomes smaller. Accordingly, if the clock signal bus is located in an array of signal buses such that the through via to which it is electrically connected is the through via at the end of a row of a plurality of through vias in an opening, common-mode current due to the clock signal can be minimized, and thus EMI can also be minimized.

In a ninth aspect, the signal buses other than the clock signal bus are video signal transmission buses.

In a tenth aspect, a tab module supplies a video signal to a liquid crystal display panel.

In an eleventh aspect, the circuit board comprises a ground layer and at least one circuit layer, which are stacked and insulated from each other by at least one insulation layer, a particular circuit layer having at least one signal bus extending as a substantially straight line in a longitudinal direction of the circuit board and adapted for being supplied with a high-frequency signal, and the ground layer having openings therein. In the circuit board, each signal bus has a plurality of signal input points adapted to receive a high-frequency signal having a frequency higher than a particular value and a signal output point adapted to transmit the high-frequency signal, the plurality of signal input points being disposed substantially symmetrically with respect to the signal output point in each signal bus and openings which are also disposed substantially symmetrically with respect to the signal output point.

The positions of the signal input points and the signal output point in the circuit board of the eleventh aspect are in a reverse relationship with respect to the positions of the signal input point and the signal output points in the circuit board of the first aspect, respectively. Accordingly, the substantially symmetrical structure of the first to tenth aspects for offsetting common-mode currents in a circuit board may also apply to a circuit board in which the signal input point and the signal output points in the above described first aspect are replaced by a signal output point and signal input points, respectively, providing a similar effect.

In a twelfth aspect, the circuit board comprises a ground layer having openings therein and at least one circuit layer, which are stacked and insulated from each other by at least one insulation layer, and a particular circuit layer having at least one signal bus extending as a substantially straight line in a longitudinal direction of the circuit board and adapted for being supplied with a high-frequency signal. In the circuit board, each signal bus has a signal input point adapted to receive a high-frequency signal having a frequency higher than a particular value and a plurality of signal output points adapted to transmit the high-frequency signal, the plurality of signal output points being disposed substantially symmetrically with respect to the signal input point in each signal bus, the openings also being disposed substantially symmetrically with respect to the signal input point, and the ground surface adapted for being part of a circuit for supplying the high-frequency signal to the signal bus.

In a thirteenth aspect, the circuit board comprises a ground layer having a plurality of openings and is adapted for being electrically connected to a load and a signal source, a circuit layer stacked and insulated from the ground layer by an insulation layer, and a signal bus positioned on the circuit layer extending as a substantially straight line in a longitudinal direction of the circuit board, the signal bus electrically connected to the signal source at a signal input point and electrically connected to the load at a plurality of signal output points, and the plurality of signal output points and the openings being disposed substantially symmetrically with respect to the signal input point.

In a fourteenth aspect, the circuit board is a microstrip-type of circuit board. The microstrip-type of circuit board includes, for example, a source driver card that is used to drive a liquid crystal display.

The aforementioned aspects of the invention will now be described with respect to the provided drawings. In FIG. 1, there is shown an embodiment of a microstrip-type source driver card 10 for a liquid crystal display according to one aspect of the invention. The driver card 10 comprises four layers, a first layer L1, second layer L2, third layer L3, and fourth layer L4, from top to bottom in the Z-axis direction, and insulation layers (not shown) interposed between the four layers to insulate adjacent layers L1, L2, L3 and L4 from each other such that driver card 10 forms a rigid board. Tab modules 11 comprise liquid crystal display driver elements and tab leads 12 are positioned on first layer L1. A plurality of tab modules 11 are spaced in the Y-axis direction, and a plurality of tab leads 12 extend from pins (not shown) on each tab module 11 in the X-axis direction. On second layer L2, a plurality of video signal buses 13 extend substantially parallel to each other in the Y-axis direction. On third layer L3, a ground surface 14 is formed. Fourth layer L4 is for other circuit wiring (not shown). Through vias 15 pass through these four layers in the Z-axis direction, thereby electrically connecting each video signal bus 13 to a corresponding tab lead 12. Contact between ground surface 14 and through vias 15 is prevented by forming a clearance hole 16 for each through via 15 passing through ground surface 14. In driver card 10, clearance holes 16 partially overlap each other to form openings so as to accommodate a fine wiring pitch of video signal buses 13.

In FIG. 2, there is shown a schematic diagram of a microstrip-type source driver card 20 for a liquid crystal display. Driver card 20 is of an 8-bit type. A centerline 21 is defined as a symmetrical line of board 22, and extends parallel to the X-axis. Driver card 20 comprises four layers, a first layer being a component layer, a second layer being a video signal bus circuit layer, a third layer being a ground layer on which a ground surface 24 is formed and a fourth layer on which a plurality of tab modules 43 are mounted and a plurality of tab leads 44 extending downward from tab modules 43 in the X-axis direction. The layers comprising driver card 20 have insulation layers (not shown) interposed therebetween so as to insulate the layers from each other. A plurality of openings 27 are formed in the ground layer of driver card 20 along a line that extends in the Y-axis direction. A plurality of through vias 32 are positioned in openings 27 that are proximate to centerline 21, and a plurality of through vias 30 are positioned in openings 27 that are distal to centerline 21. A plurality of openings 28 are formed in the ground layer of driver card 20 along a line that extends in the Y-axis direction such that there is no overlap with openings 27. A plurality of through vias 33 are positioned in one of openings 28 that is proximate to centerline 21, and a plurality of through vias 31 are positioned in openings 28 that are distal to centerline 21. Openings 27 and 28 are substantially equal in length and width, and inclined at substantially the same angle, in one example, 45° to the X-axis direction and the Y-axis direction such that these are substantially parallel to each other.

Tab driver 34 is disposed in the first layer such that its centerline is substantially aligned with centerline 21. A plurality of odd driver output lines 35 extend from tab driver 34 on one side of centerline 21 in the X-axis direction and are electrically connected to a plurality of through vias 32. A plurality of even driver output lines 36 extend from tab driver 34 on the other side of centerline 21 in the X-axis direction and are electrically connected to a plurality of through vias 33. In the second layer, a plurality of odd video signal buses 40 and a plurality of even video signal buses 41 both extend in the Y-axis direction. Odd video signal buses 40 are electrically connected to through vias 30, and even video signal buses 41 are electrically connected to through vias 31. Through vias 30 and 31 as signal output points are disposed substantially symmetrically with respect to through vias 32 and 33 as signal input points, respectively. Along odd video signal buses 40, the distances from each of the plurality of through vias 32 to a corresponding one of the plurality of through vias 30 are substantially equal, and along even video signal buses 41, the distances from each of the plurality of through vias 33 to a corresponding one of the plurality of through vias 31 are substantially equal. The third layer comprises a ground layer on which a ground surface 24 is formed. In the fourth layer, a plurality of tab modules 43 which comprise liquid crystal display driver elements are positioned along a longitudinal edge (that extends in the Y-axis direction) of board 22. Each of the plurality of tab modules 43 has pins (not shown) positioned thereupon, and a plurality of tab leads 44 that extend in the X-axis direction to electrically connect the pins of each of the plurality of tab modules 43 to through vias 30 or 31. The pins on one half of a tab module 43 are electrically connected to through vias 30, and the pins on the other half are electrically connected to through vias 31.

In FIG. 3, there is shown a schematic diagram of odd driver output lines 35 and even driver output lines 36 extending from tab driver 34 in the Y-axis direction. In an embodiment wherein pins (not shown) on opposing sides of tab driver 34 in the Y-axis direction serve as connection points for tab driver 34, driver output lines 35 and 36 are routed in the first layer such that lines 35 and 36 run toward each other in the Y-axis direction just below tab driver 34, and thereafter turn by 90° to run in the X-axis direction and exit from below tab driver 34, and extend to odd video signal buses 40 and even video signal buses 41, respectively.

In FIGS. 4, 5 and 6 there are shown perspective views of simulation models 45, 46 and 47, respectively. In simulation models 45 (Model Z), 46 (Model C dxx mm, wherein xx is a numeric value representing a displacement d in units of millimeters (mm), for example, Model C d10 mm means d=10 mm), and 47 (Model C), video signal bus 52 is the only signal bus therein. The commonalities of simulation models 45, 46 and 47 are described hereinbelow. Ground surface 50 is substantially rectangular in shape with a longitudinal direction in the Y-axis direction. A plurality of openings 51 are formed along the Y-axis direction, and are substantially rectangular in shape with elongation in the X-axis direction. Through vias 53 are positioned in each of the plurality of openings 51, and electrically connected to video signal bus 52. Bus leads 54 are electrically connected to lower ends (in the Z-axis direction) of through vias 53, and loads 55 are electrically connected to distal ends of bus leads 54.

Differences between simulation models 45, 46 and 47 are described hereinbelow. Simulation model 45 of FIG. 4 has video signal bus 52 extending beyond through via 53 in the Y-axis direction, and a high-frequency signal source 56 connected thereto. Simulation model 46 of FIG. 5 has a centerline 59 shown. Ground surface 50 is substantially symmetrical with respect to centerline 59, and the plurality of openings 51 are disposed substantially symmetrically with respect to centerline 59. High-frequency signal source 56 is displaced by d in the +Y-axis direction with respect to centerline 59. Simulation model 47 of FIG. 6 has high-frequency signal source 56 positioned on centerline 59. Accordingly, simulation model 47 has video signal bus 52, through vias 53, bus leads 54 and high-frequency signal source 56 disposed substantially symmetrically with respect to centerline 59. Simulation model 47 corresponds to a model in which the number of odd video signal buses 40 or even video signal buses 41 in driver card 20 of FIG. 2 is one.

In FIG. 7, there is shown a diagram with radiation field simulation results for the models of FIGS. 4, 5 and 6. A relationship between radiation field value and frequency (GHz) at a position of maximum radiation field value on a spherical surface at a distance of 3 m from the center of the models is shown. For Model C of FIG. 6, it is seen that greater EMI suppression is provided as compared with the models of FIGS. 4 and 5. In driver card 20 of FIG. 2, each odd video signal bus 40 and each even video signal bus 41 have a symmetrical structure substantially similar to that of model C, so it can therefore be understood that EMI generated by each odd video signal bus 40 and a respective even video signal bus 41 is accordingly suppressed, providing suppression of EMI for driver card 20 as a whole.

In FIG. 8, there is shown a diagram of a relationship between longitudinal (Y-axis direction) position and common-mode current for a simulation based on model 45 (Model Z) of FIG. 4. A summation of the areas of the regions between the characteristic lines and the abscissa is known as Sm. The area of a region above the abscissa has a positive (+) value, and the area of a region below the abscissa has a negative (−) value. Electro-magnetic radiation generated by a common-mode current is proportional to the product of the amplitude of the common-mode current and the length of a conductor through which the current is flowing. Thus, a summation of the areas described hereinabove corresponds to relative intensity of electro-magnetic radiation at an observation point. As the absolute value of Sm (|Sm|) approaches zero, common-mode current is offset as a whole, and EMI is suppressed. In simulation model 45, symmetry is substantially lost by high-frequency signal source 56 having an asymmetrical position with respect to the model, thus |Sm| is relatively large, and suppression of EMI is inadequate.

In FIG. 9, there is shown a diagram of a relationship between longitudinal (Y-axis direction) position and common-mode current for a simulation based on model 46 (Model C d10 mm) of FIG. 5. Although high-frequency signal source 56 is close to centerline 59 of simulation model 46, displacement d=10 mm from centerline 59 causes a relatively large |Sm|.

In FIG. 10, there is shown a diagram of a relationship between longitudinal (Y-axis direction) position and common-mode current for a simulation based on model 47 (model C) of FIG. 6. High-frequency signal source 56 is located on centerline 59 of simulation model 47, thus |Sm| is nearly zero, and as a result, EMI can be substantially suppressed.

In FIG. 11, there is shown a schematic diagram of a microstrip-type source driver card for a liquid crystal display 65. Centerline 67 of driver card 65 extends in the X-axis direction. Board 68 has a substantially symmetrical shape with respect to centerline 67, and a ground surface 69 that substantially covers the surface of board 68, with the exception of insulation surfaces 83 described hereinbelow. Ground surface 69 also has a substantially symmetrical shape with respect to centerline 67. Driver card 65 comprises four layers: a first layer being a component layer, a second layer being a circuit layer containing circuitry other than video signal buses, a third layer being a video signal bus circuit layer and a fourth layer being a ground layer on which a ground surface 69 is formed. The layers comprising driver card 65 have insulation layers (not shown) interposed therebetween so as to insulate the layers from each other.

Opening 72 and a plurality of openings 73 are formed in the Z-axis direction in the layers of driver card 65. Opening 72 is on centerline 67, and openings 73 are positioned substantially symmetrically with respect to opening 72. Openings 73 on the left side of opening 72 incline at an angle of about 45° with right sides being lower in the X-axis direction, while openings 73 on the right side of opening 72 incline at an angle of about 45° with left sides being lower in the X-axis direction. Pluralities of through vias 75 and 76 are positioned in a row in openings 72 and 73, respectively, and extend in the Z-axis direction. Tab driver 78 is disposed in the first layer such that its centerline is substantially aligned with centerline 67. A plurality of driver output lines 79 electrically connect pins (not shown) of tab driver 78 to through vias 75. In the third layer, a plurality of video signal buses 81 extend in the Y-axis direction, and are electrically connected to through vias 75 and 76.

The fourth layer comprises a ground layer on which ground surface 69 is formed. A plurality of substantially trapezoidal shaped insulation surfaces 83 are formed in the fourth layer and are disposed substantially symmetrically with respect to centerline 67 such that board 68 is exposed at the areas of insulation surfaces 83, and ground surface 69 remains in the areas other than insulation surfaces 83. Insulation surfaces 83 contain openings 73 therein. Edges of insulation surfaces 83 that extend in the X-axis direction are substantially straight lines, with another edge being a substantially straight inclined line that is substantially parallel to openings 73. A plurality of tab modules 85 are mounted in the fourth layer along an edge of board 68 which extends in the Y-axis direction, and are positioned so as to correspond to each of the plurality of insulation surfaces 83. Tab leads 86 extend in the X-axis direction on insulation surfaces 83 and electrically connect pins (not shown) of tab modules 85 to through vias 76. If the plurality of video signal buses 81 are sequentially numbered 1, 2, . . . , n from top to bottom in the X-axis direction, tab modules 85 on the left side of centerline 67 are electrically connected to the No. 1, 2, . . . , n video signal buses 81 from the left to right pins, respectively, of tab modules 85, and tab modules 85 on the right side of centerline 67 are electrically connected to the No. 1, 2, . . . , n video signal buses 81 from the right to left pins, respectively, of tab modules 85. Thus, some elements of driver card 65 which are substantially symmetrical with respect to centerline 67 are the shape of ground surface 69, video signal buses 81, opening 72, openings 73, through vias 75 and 76, insulation surfaces 83, tab modules 85 and tab leads 86.

In FIGS. 12, 13 and 14 there are shown perspective views of simulation models 90, 91 and 92, respectively. In simulation models 90 (ms1BNoSym), 91 (msx2B) and 92 (msx1B), video signal bus 97 is the only signal bus therein. The commonalities of simulation models 90, 91 and 92 are described hereinbelow. Centerline 94 runs in the X-axis direction. Ground surface 95 is substantially rectangular in shape with a longitudinal direction in the Y-axis direction. A plurality of insulation surfaces 96 are substantially rectangular in shape, and are disposed substantially symmetrically with respect to centerline 94. Video signal bus 97 extends in the Y-axis direction. Bus leads 98 are electrically connected to video signal bus 97 and extend in the X-axis direction at positions corresponding to insulation surfaces 96. Loads 99 are electrically connected to the ends of bus leads 98 which are distal to video signal bus 97.

Differences between simulation models 90, 91 and 92 are described hereinbelow. Simulation model 90 of FIG. 12 has bus leads 98 extending along the same sides of insulation surfaces 96 with respect to the Y-axis direction. Also, video signal bus 97 is extended in the Y-axis direction, and high-frequency signal source 100 is electrically connected to the distal end thereof. Simulation model 91 of FIG. 13 has high-frequency signal source 100 positioned and electrically connected to video signal bus 97 at centerline 94. Simulation model 92 of FIG. 14 has bus leads 98 disposed substantially symmetrically with respect to centerline 94 such that bus leads 98 are disposed on distal sides of insulation surfaces 96 in the Y-axis direction with respect to centerline 94. Thus, in simulation model 92, ground surface 95, insulation surfaces 96 and bus leads 98 are disposed and/or shaped substantially symmetrically with respect to centerline 94. The structure of driver card 65 of FIG. 11 is therefore consistent with the structure of simulation model 92 as some elements of driver card 65 such as ground surface 69, insulation surfaces 83 and tab leads 86 are disposed and/or shaped substantially symmetrically with respect to centerline 67.

In FIG. 15, there is shown a diagram with radiation field simulation results for the models of FIGS. 12, 13 and 14. A relationship between frequency (GHz) and radiation field value at a distance of 3 m in the X-axis direction is shown. For simulation model 92 of FIG. 14 (msx1B), it is seen that greater EMI suppression is provided as compared with the models of FIGS. 12 and 13. In driver card 65 of FIG. 11, ground surface 69, video signal buses 81, opening 72, openings 73, through vias 75 and 76, insulation surfaces 83, tab modules 85 and tab leads 86 are disposed and/or shaped substantially symmetrically with respect to centerline 67, so it can therefore be understood that EMI from driver card 65 is substantially suppressed.

In FIG. 16, there is shown a diagram of a relationship between longitudinal (Y-axis direction) position and common-mode current for a simulation based on model 90 (ms1BNoSym) of FIG. 12. A summation of the areas of the regions between the characteristic lines and the abscissa is known as Ss. The area of a region above the abscissa has a positive (+) value, and the area of a region below the abscissa has a negative (−) value. As the absolute value of Ss (|Ss|) approaches zero, common-mode currents are offset by each other so as to provide EMI suppression. Simulation model 90 has an asymmetrical characteristic line with respect to the abscissa, so |Ss| is relatively large, and EMI is therefore correspondingly large.

In FIG. 17, there is shown a diagram of a relationship between longitudinal (Y-axis direction) position and common-mode current for a simulation based on model 91 (msx2B) of FIG. 13. Although high-frequency signal source 100 is disposed on centerline 94 in simulation model 91, bus leads 98 are disposed asymmetrically with respect to centerline 94, causing relatively large |Ss| and inadequate suppression of EMI.

In FIG. 18, there is shown a diagram of a relationship between longitudinal (Y-axis direction) position and common-mode current for a simulation based on model 92 (msx1B) of FIG. 14. Bus leads 98 and high-frequency signal source 100 are disposed substantially symmetrically with respect to centerline 94 in simulation model 92, causing |Ss| to approach zero, and as a result, EMI can be substantially suppressed.

While there have been shown and described what are at present the preferred embodiments of the invention, it will be obvious to those skilled in the art that various changes and modifications may be made therein without departing from the scope of the invention as defined by the appended claims.

What is claimed is:

1. A circuit board comprising:
   a ground layer and at least one circuit layer, at least one insulation layer between said ground layer and said at least one circuit layer, said at least one circuit layer having at least one signal bus extending as a substantially straight line in a longitudinal direction of said circuit board and adapted for being supplied with a high-frequency signal, said ground layer having openings therein; and
   said at least one signal bus having a signal input point adapted to receive said high-frequency signal having a frequency higher than a particular value and a plurality of signal output points adapted to transmit said high-frequency signal, said plurality of signal output points disposed substantially symmetrically with respect to said signal input point in said at least one signal bus, said openings within said ground layer being disposed substantially symmetrically with respect to said signal input point to provide EMI suppression for said circuit board.

2. The circuit board of claim 1 further including a plurality of electrically conductive through vias positioned in said openings, said plurality of signal output points positioned on said plurality of through vias.

3. The circuit board of claim 1 wherein said signal input point is disposed on a substantially straight symmetrical line which is substantially perpendicular to said at least one signal bus.

4. The circuit board of claim 1 wherein said ground layer includes a ground surface having a substantially symmetrical shape with respect to said substantially straight symmetrical line.

5. The circuit board of claim 1 wherein said circuit board includes a plurality of said signal buses.

6. The circuit board of claim 1 wherein said at least one signal bus is a clock signal bus.

7. The circuit board of claim 6 wherein said circuit board includes a plurality of said signal buses, said signal buses other than said clock signal bus being video signal transmission buses.

8. The circuit board of claim 1 wherein said circuit board is electrically connected to a load.

9. The invention of claim 1 wherein said circuit board is a microstrip-type of circuit board.

10. A circuit board comprising:
    a ground layer and at least one circuit layer, at least one insulation layer between said ground layer and said at least one circuit layer, said at least one circuit layer having at least one signal bus extending as a substantially straight line in a longitudinal direction of said circuit board and adapted for being supplied with a high-frequency signal, said ground layer having openings therein;
    said at least one signal bus having a signal input point adapted to receive said high-frequency signal having a frequency higher than a particular value and a plurality of signal output points adapted to transmit said high-frequency signal, said plurality of signal output points disposed substantially symmetrically with respect to said signal input point in said at least one signal bus, said openings within said ground layer being disposed substantially symmetrically with respect to said signal input point to provide EMI suppression for said circuit board; and
    said circuit board further including a side edge having a plurality of tab modules located thereon and having pins thereon, said tab modules extending in a longitudinal direction of said circuit board, said plurality of signal output points of said at least one signal bus correspondingly connected to said pins on said plurality of tab modules through a plurality of tab leads, said plurality of tab leads disposed substantially symmetrically with respect to a straight line passing through said signal input point of said at least one signal bus and substantially perpendicular to said at least one signal bus.

11. The circuit board of claim 10 further including a plurality of electrically conductive through vias positioned in said openings, said plurality of signal output points positioned on said plurality of through vias, said plurality of tab leads extending from said plurality of through vias in a direction substantially perpendicular to said at least one signal bus.

12. The circuit board of claim 10 wherein said signal input point is disposed on a substantially straight symmetrical line which is substantially perpendicular to said at least one signal bus.

13. The circuit board of claim 10 further including a first inclined line which inclines with respect to both said at least one signal bus and said plurality of tab leads, and a second inclined line which inclines with respect to said substantially straight symmetrical line, selected ones of said openings in said ground layer oriented in a row on a first side of said substantially straight symmetrical line substantially parallel to said first inclined line and selected ones of said openings in said ground layer oriented in a row on a second side of said substantially straight symmetrical line substantially parallel to said second inclined line.

14. The circuit board of claim 10 wherein said ground layer includes a ground surface having a substantially symmetrical shape with respect to said substantially straight symmetrical line.

15. The circuit board of claim 10 wherein said circuit board includes a plurality of said signal buses.

16. The circuit board of claim 10 wherein said at least one signal bus is a clock signal bus.

17. The circuit board of claim 16 wherein said circuit board includes a plurality of said signal buses, said signal buses other than said clock signal bus being video signal transmission buses.

18. The circuit board of claim 10 further including a liquid crystal display, said plurality of tab modules each adapted for supplying a video signal to said liquid crystal display.

19. The circuit board of claim 10 wherein said circuit board is electrically connected to a load.

20. The invention of claim 10 wherein said circuit board is a microstrip-type of circuit board.

* * * * *